United States Patent [19]

Tanaka et al.

[11] Patent Number: 4,587,500
[45] Date of Patent: May 6, 1986

[54] VARIABLE REACTANCE CIRCUIT PRODUCING NEGATIVE TO POSITIVE VARYING REACTANCE

[75] Inventors: Kanji Tanaka, Gunma; Kazuhisa Ishiguro, Ota, both of Japan

[73] Assignees: Sanyo Electric Co., Ltd., Osaka; Tokyo Sanyo Electric Co., Ltd., Gunma, both of Japan

[21] Appl. No.: 535,962

[22] Filed: Sep. 23, 1983

[30] Foreign Application Priority Data

Sep. 27, 1982 [JP] Japan .................. 57-169338

[51] Int. Cl.⁴ ............ H03H 11/48; H03H 11/52
[52] U.S. Cl. ............................. 333/213; 330/257; 333/214; 333/216
[58] Field of Search ............ 333/213–217; 330/251, 254, 257

[56] References Cited

U.S. PATENT DOCUMENTS

| | | | |
|---|---|---|---|
| 3,597,697 | 8/1971 | Matarese | 333/215 X |
| 3,758,885 | 9/1973 | Voorman et al. | 333/215 |
| 3,986,145 | 10/1976 | Hongu et al. | 333/214 X |
| 4,318,054 | 3/1982 | Yokoyama | 333/214 X |
| 4,464,632 | 8/1984 | Yoshihisa et al. | 330/254 |

FOREIGN PATENT DOCUMENTS

| | | | |
|---|---|---|---|
| 0064420 | 5/1980 | Japan | 333/213 |
| 2005507 | 4/1979 | United Kingdom | 333/216 |

Primary Examiner—Eugene R. LaRoche
Assistant Examiner—Benny Lee
Attorney, Agent, or Firm—Armstrong, Nikaido, Marmelstein & Kubovcik

[57] ABSTRACT

A variable reactance circuit which can produce equivalent reactance varying from negative given values to positive given values in accordance with fundamental reactance elements such as capacitor, coil, etc. The present invention has a big advantage of being capable of easily producing the positive, negative equivalent reactance given times as much as the basic reactance element with the use of a circuit which can be integrated.

7 Claims, 8 Drawing Figures

VARIABLE REACTANCE CIRCUIT PRODUCING NEGATIVE TO POSITIVE VARYING REACTANCE

BACKGROUND OF THE INVENTION

1. Field of the Invention

The present invention relates to a variable reactance circuit, and particularly to a variable reactance circuit, which can produce equivalent reactance varying from negative given values to positive given values in accordance with fundamental reactance elements such as capacitor, coil, etc.

2. Description of the Prior Art

In general, capacitor reactance elements such as a capacitor, etc. and inductive reactance elements such as coil, etc. often interfere with building in an integrated circuit (IC) which are extensively used in recent years. Therefore, many attempts are made to produce the equivalent reactance with the use of circuits easily formed on the IC in such a manner that the capacitors of small capacity are integrated in circuit even at the present and, also, the equivalent inductive reactances are also integrated, in circuit with the use of circuits such as a gyrator. However, they are of a fixed type or can be varied within the positive reactance range, and variable reactance circuits have not existed up to now, which can vary the reactance throughout a wide range from a negative given value to a positive given value.

SUMMARY OF THE INVENTION

Accordingly, an essential object of the present invention is to provide a variable reactance circuit, which can produce equivalent reactance varying from negative given values to positive given values through a wide range in accordance with fundamental reactance elements such as capacitor, coil, etc.

Another object of the present invention is to provide a variable reactance circuit which can easily be integrated into an integrated circuit.

A further object of the present invention is to provide a variable reactance circuit which can be assembled within an oscillation circuit to produce a stable output signal at free run frequency that is the inherent or natural frequency of the oscillation circuit.

According to the present invention, there is provided a variable reactance circuit comprising a first amplification circuit, which operates as a positive equivalent reactance in accordance with the fundamental reactance elements, a second amplification circuit, which operates as a negative equivalent reactance in accordance with the fundamental reactance elements, an output terminal connected in common to the output terminals of the first and second amplification circuits. A control signal is applied to the first and second amplification circuits so that the equivalent reactance seen from the output terminals are adapted to be varied from a negative given value to a positive given value.

These and other objects, features, aspects and advantages of the present invention will become apparent from the following detailed description of the present invention when taken in conjunction with the accompanying drawings.

DESCRIPTION OF THE PREFERRED EMBODIMENTS

Figure 1:
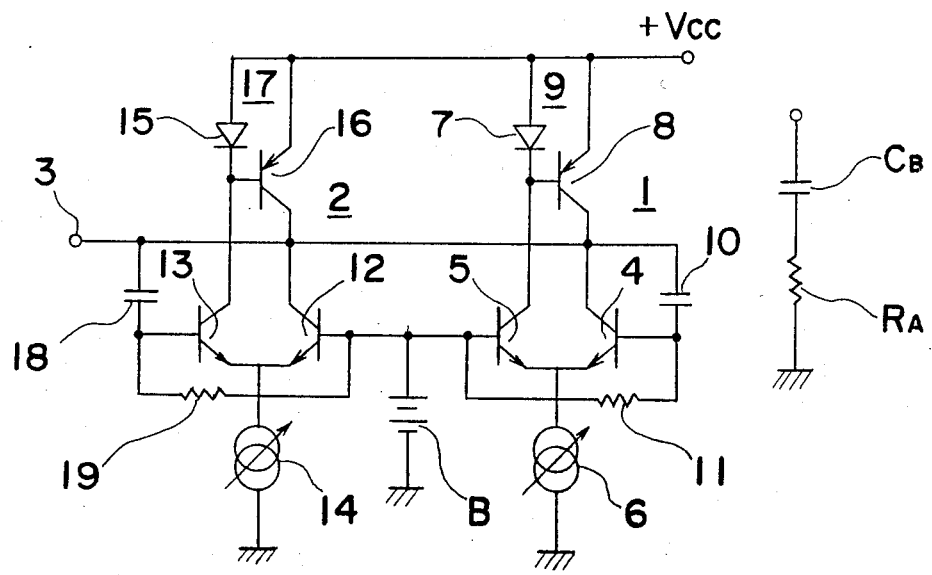
FIG. 1 is a circuit diagram showing a variable reactance circuit in accordance with a first embodiment of the present invention.

Referring to FIG. 1, there shows a variable reactance circuit of first embodiment of the present invention comprising a first amplification circuit 1 which operates as a positive equivalent reactance, a second amplification circuit 2 which operates as a negative equivalent reactance, and an output terminal 3 to which the output terminals of the first and second amplification circuits 1 and 2 are connected in common. The first amplification circuit 1 is composed of a first transistor 4 and second transistor 5 of which the emitters are connected in common, a first variable current source 6 is connected to the common emitter of the first and second transistors 4, 5, a first current mirror circuit 9 composed of a first diode 7 and a third transistor 8 of which the emitter is connected to the cathode of the diode 7, the base between the anode of the diode and the collector of the transistor 5, and the collector to the collector of the transistor 4, a first capacitor 10 connected between the collector and the base of the first transistor 4, a first resistor 11 connected between the bases of the first and second transistors 4, 5. The second amplification circuit 2 is composed of a fourth transistor 12 and fifth transistor 13 of which the emitters are connected in common, a second variable current source 14 connected to the common emitter of the fourth and fifth transistors 12, 13, a second current mirror circuit 17 composed of a second diode 15 and a sixth transistor 16 of which the emitter is connected to the cathode of the diode 15, the base between the anode of the diode and the collector of the transistor 13, and the collector to the collector of the transistor 12, a second capacitor 18 connected between the collector of the fourth transistor 12 and the base of the fifth transistor 18, a second resistor 19 connected between the bases of the fourth, fifth transistors 12, 13. The bases of the first and fourth transistors 5, 12 are connected in common to a direct current voltage source (B), while the cathodes of the first and second diodes 7, 15 are connected in common to a voltage line of power source (+Vcc).

Assume that a current flowing into the first variable current source 6 is $I_1$, a current flowing into the second variable current source 14 is 0, the voltage of the output terminal 3 is $e_0$, a current flowing into the first capacitor 10 is $i_1$, and the voltage $e_0$ and the current $i_1$ come to have the phase difference of 90 degrees, and the current $i_1$ which is 90 degrees out-of-phase to the voltage $e_0$ flows to the first resistor 11 from the first capacitor 10. At this time, the base voltage $e_1$ of the first transistor 4 is as follows.

$$e_1 = R \cdot i_1, \tag{1}$$

wherein R is a resistance value of the first resistor 11. Then the current $i_1$ flowing into the first capacitor 10 is as follows.

$$i_1 = \frac{e_0}{R + \frac{1}{jwC}}, \quad (2)$$

wherein C is the capacity reactance of the first capacitor, and w is the angular frequency $$\left(\frac{1}{jwC} > R\right).$$

Also, the current $i_2$ flowing into the output terminal 3 is as follows.

$$i_2 = e_1 \cdot gm + i_1, \quad (3)$$

wherein gm is the mutual conductance between the input and output of the differential amplifier, and the value of $e_1 \cdot gm$ is always positive. When the phase of the collector current $i_3$ ($=e_1 \cdot gm$) of the first transistor 4 is sufficiently more than the current $i_1$ flowing into the first capacitor 10, the equation is as follows.

$$i_2 = e_1 \cdot gm \quad (3)'$$

The phase of the collector current $i_3$ of the first transistor 4 is equal to the phase of the current $i_1$ flowing into the first capacitor 10. Accordingly, the current $i_2$ flowing into the output terminal 3 from the (1), (2) and (3)' equations is as follows.

$$i_2 = \frac{e_0}{\frac{1}{gm} + \frac{1}{jwR \cdot C \cdot gm}} \quad (4)$$

Figure 2:
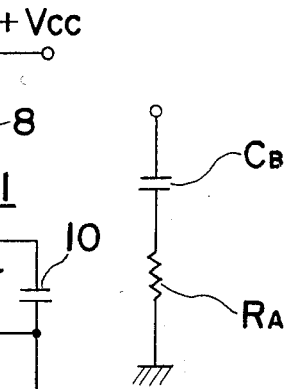
FIG. 2 is a equivalent circuit diagram relating to FIG. 1.

When it is seen from the output terminal 3, it means that the circuit of FIG. 1 can be equivalently converted into a series circuit composed of a resistor ($R_A$) with (1/gm) of resistance value and a capacitor ($C_B$) with term (R·C·gm) in equation (4) in capacity reactance as shown in FIG. 2. Assume that the (1/gm) is small, the circuit of FIG. 1 can be considered as the equivalent capacitive reactance of the capacitor ($C_B$) of the term (R·C·gm). For example, assume that the value of the first resistor 11 is $10^3\Omega$, the value of the first capacitor 10 is $10_pF$, the mutual conductance is (1/50), and the equivalent capacity reactance becomes as large as $200_pF$ ($=C_B=10^3(\Omega) \times 10(pF) \times (1/50)(1/\Omega)$). Such large reactance of 200 pF as described hereinabove can easily be formed within the IC.

Also, the mutual conductance (gm) is shown by the following equation.

$$gm = \frac{\alpha qI}{4kT} \cdot 2 = \frac{\alpha}{52} I_1, \quad (5)$$

wherein k is Boltzmann's constant, T is an absolute temperature, q is the electric charge amount of electron, $\alpha$ is a current amplification rate, and $I_1$ is a current flowing into the first variable current source 6.

Accordingly, the current $I_1$ flowing into the first variable current source 6 and the mutual conductance (gm) have a proportional relation, and the equivalent capacity reactance ($C_B$) assumes a proportional relation with the current $I_1$. The equivalent capacity reactance ($C_B$) which varies from zero to the positive given value can be produced through variation in the current $I_1$.

Then, assume that the current flowing into the variable current source 6 is zero, the current flowing into the second variable current source 14 is $I_2$, the current flowing into the second capacitor 18 is $i_4$, and the base voltage $e_3$ of the fifth transistor 13 is as follows.

$$e_3 = R \cdot i_4, \quad (6)$$

wherein R is a resistance value of the second resistor 19. The current $i_4$ flowing into the second capacitor 18 is as follows.

$$i_4 = \frac{e_0}{R + \frac{1}{jwc}}, \quad (7)$$

wherein C is the capacity reactance of the second capacitor 18, and w is an angular frequency. Also, the current $i_5$ in the output terminal 3 is as follows.

$$i_5 = -e_3 \cdot gm + i_4, \quad (8)$$

wherein gm is the mutual conductance between the input and output of the differential amplifier, and the value of $-e_3 \cdot gm$ is always negative. When the collector current $i_6$ ($= -e_3 \cdot gm$) of the fourth transistor 12 is sufficiently more than the current $i_4$ flowing into the second capacitor 18, the equation is as follows.

$$i_5 = -e_3 \cdot gm = -R \cdot i_4 \cdot gm \quad (8)'$$

As apparent from the equation (8)', the collector current $i_6$ of the fourth transistor 12 becomes reverse in phase to the current $i_4$ flowing into the second capacitor 18. Accordingly, from the (7) and (8)' equations, $$i_5 = \frac{e_0}{-\frac{1}{gm} + \frac{1}{jw(-R \cdot C \cdot gm)}} \quad (9)$$

When it is seen from the output terminal 3, it means that the circuit of FIG. 1 is equivalently converted into a series circuit composed of a resistor with $$\left(-\frac{1}{gm}\right)$$

in resistance value and a capacitor with ($-R \cdot C \cdot gm$) in capacity reactance.

Also, since the mutual conductance is represented by $$gm = \frac{\alpha}{52} I_2, \quad (10)$$

as in the (5) equation, the equivalent capacity reactance ($C_B$) which varies from the zero to the negative given value can be produced through the variation of the current $I_2$ flowing to the second variable current source 14.

Figure 3:
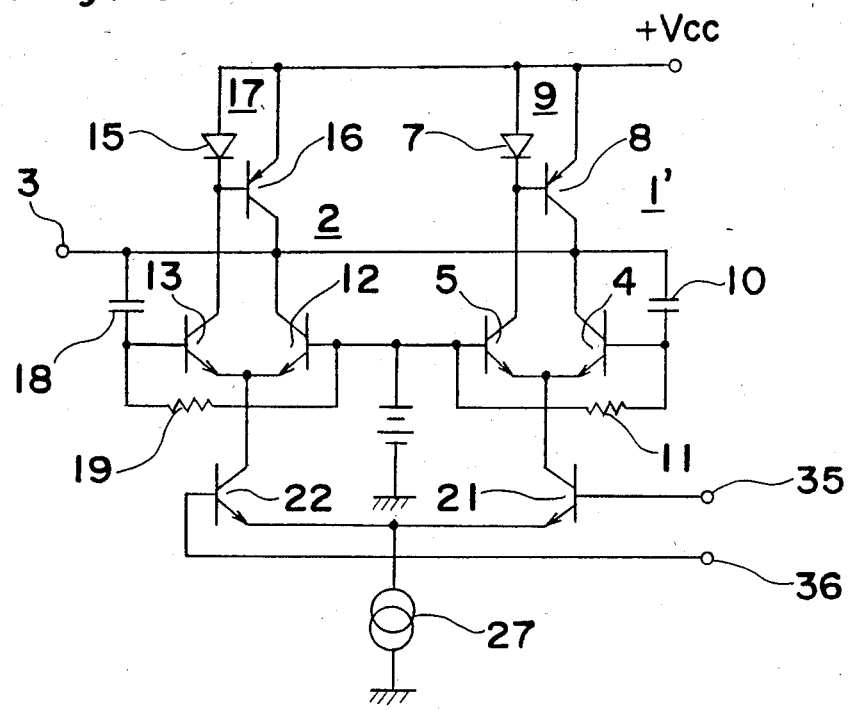
FIGS. 3 to 6 are circuit diagrams showing variable reactance circuit in accordance with second, third, fourth and fifth embodiments thereof, respectively.

Accordingly, connecting the first and second amplification circuits 1 and 2 as shown in FIG. 1 to vary the currents $I_1$ and $I_2$ flowing into the first and second variable current sources 6 and 14, and the equivalent reactance seen from the output terminal 3 can be varied from a negative given value to a positive given value, resulting in that a variable reactance circuit can be provided. Although in the first embodiment of FIG. 1 described above, the first, second variable current sources 6 and 14 are controlled independently and the first and second variable current sources 6 and 14 can be composed of a pair of transistors 21, 22 of which the emitters are connected in common to one constant-current source 27, the bases to the corresponding first and second control terminals 35 and 36, and the collectors to the corresponding emitters of the first and second, and fourth and fifth transistors 4, 5 and 12, 13, respectively, as shown in FIG. 3 of a second embodiment 1' of the present invention. A differential control signal is applied upon the bases of the pair of transistors through the corresponding control terminals 35, 36 so that the first and second amplification circuits 1 and 2 can be controlled in common. In this embodiment, the positive equivalent reactance and the negative equivalent reactance vary in accordance with the differential control signal so that a mixed equivalent reactance is caused in the output terminal 3.

Figure 4:
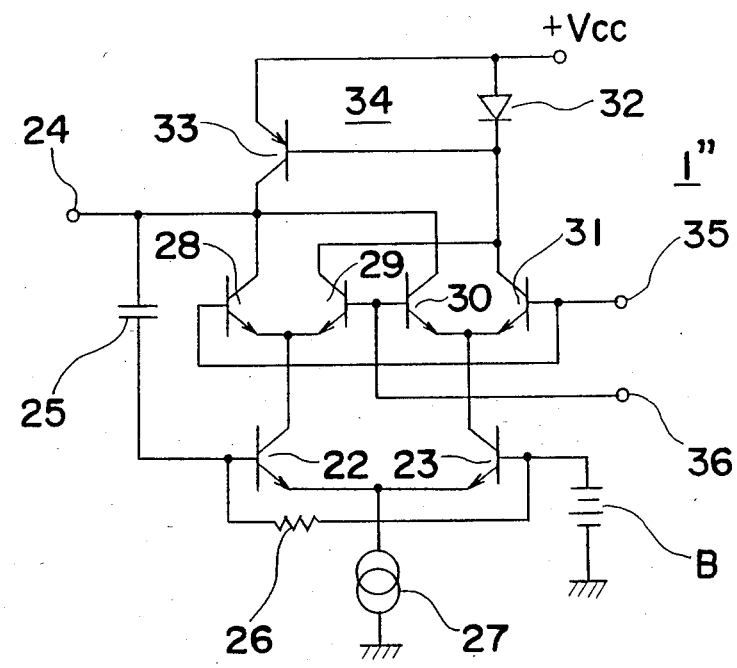

FIG. 4 shows a third embodiment of the present invention, wherein a variable reactance circuit 1" is composed of seventh transistor 22 and eighth transistor 23 of which the emitters are connected in common, a third capacitor 25 connected between the output terminal 24 and the base of the seventh transistor 22, a third resistor 26 connected between the bases of the seventh and eighth transistors 22, 23, a constant-current circuit 27 connected to the common emitter of the seventh, eighth transistors of the 22, 23, the ninth transistor 28 and tenth transistor 29 with a common emitter being connected to the collector of the seventh transistor 22, the eleventh transistor 30 and twelfth transistor 31 with a common emitter being connected to the collector of the eighth transistor 23, a third current mirror circuit 34 composed of the third diode 32, the thirteenth transistor 33. The bases of the ninth and twelfth transistors 28, 31 are connected in common to a first control terminal 35, while the bases of the tenth and eleventh transistors 29, 30 are connected in common to a second control terminal 36. The collectors of the ninth and eleventh transistors 28, 30 are connected in common to the collector of the thirteenth transistor 33 and the output terminal 24 while the collectors of the tenth and twelfth transistors 29, 31 are connected in common to the base of the thirteenth transistor 33 and the anode of the third diode 32, the cathode of the third diode 32 being connected to the emitter of the thirteenth transistor 33 and a power supply (+Vcc). The differential control signal is adapted to be applied upon the bases of the ninth through the twelfth transistors 28 through 31 through the first and second control terminals 35, 36.

Assume that a positive control voltage is applied upon the first control terminal 35, sufficiently larger than a voltage applied upon the second control terminal 36 then the ninth and the twelfth transistors 28, 31 are then turned on, and the tenth and the eleventh transistors 29, 30 are turned off, resulting in that the circuit of FIG. 4 becomes similar in construction to the first amplification circuit 1 of FIG. 1. Thus, the equivalent reactance seen from the output terminal 24 becomes a value corresponding to the equation (4).

Assume that the sufficiently larger positive control voltage is applied upon the second control terminal 36 than is applied upon the first control terminal 35, and the ninth, twelfth transistors 28, 31 are turned off, and the tenth, eleventh transistors 29, 30 are turned on, resulting in that the circuit of FIG. 4 becomes similar to the second amplification circuit 2. Thus, the equivalent reactance seen from the output terminal 24 becomes a value corresponding to the equation (9).

Assume that a control voltage of an equal value is applied upon the first and second control terminals 35, 36, then the positive equivalent reactance and, the negative equivalent reactance are cancelled and the equivalent reactance seen from the output terminal 24 becomes zero. When the control voltage to be applied upon the first, second control terminals 35, 36 is between each condition described hereinabove, the positive, negative equivalent reactance corresponding to the conduction of the ninth through the twelfth transistors 28 through 31 is produced in the output terminal 24.

Figure 5:
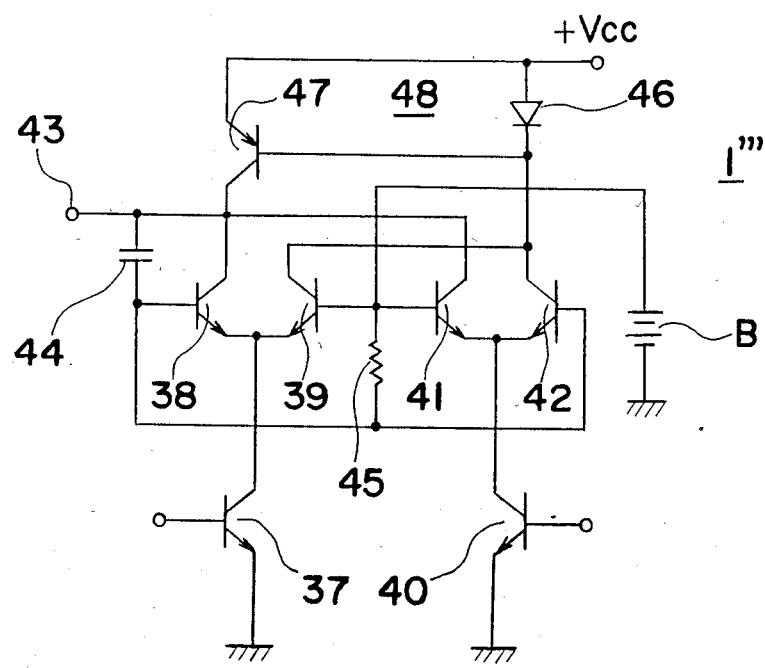

FIG. 5 shows a fourth embodiment of the present invention, wherein a variable reactance circuit 1''' is composed of the fourteenth transistor 38 and fifteenth transistor 39 with a first current source transistor 37, which becomes a variable current source, being connected to a common emitter of the fourteenth and fifteenth transistors 38, 39, the sixteenth transistor 41 and seventeenth transistor 42 with a second current source transistor 40, which becomes a variable current source, being connected to a common emitter of the sixteenth and seventeenth transistors 41, 42, the fourth capacitor 44 connected between the output terminal 43 and the base of the fourteenth transistor 38, the fourth resistor 45 connected between the common base of the fourteenth and seventeenth transistors 38, 42 and the common base of the fifteenth and sixteenth transistors 39, 41, the fourth current mirror current 48 composed of the fourth diode 46 and the eighteenth transistor 47 each connected to the collectors of the fourteenth, fifteenth, sixteenth and seventeenth transistors 38, 39, 41, 42, the cathode of the fourth diode 46 being connected with the emitter of the eighteenth transistor 47 while the anode of the fourth diode 46 is connected with the base of the eighteenth transistor 47. The given equivalent reactance is produced in the output terminal 43 in accordance with the control signal to be applied upon the bases of the first, second current source transistors 37, 40.

Assume that a given control signal is applied upon the base of the first current source transistor 37 and the control signal is not applied upon the base of the second current source transistor 40, and the collector current of the $I_1$ flows into the first current source transistor 37, resulting in that the circuit of FIG. 5 becomes the same in construction as the first amplification circuit 1 of FIG. 1. When it is seen from the output terminal 43, the positive equivalent reactance corresponding to the equation (4) is provided. And as the collector current $I_1$ varies in accordance with the value of the control signal to be applied upon the base of the first current source transistor 37, a variable reactance circuit is provided which produces the equivalent reactance from a zero to a positive given value.

Also, assume that a control signal is not applied upon the base of the first current source transistor 37 and a given control signal is applied upon the base of the second current source transistor 40, and the collector current of the $I_2$ flows into the second current source transistor 40, resulting in that the circuit of FIG. 4 becomes completely the same as the second amplification circuit 2 of FIG. 1. When it is seen from the output terminal 43, the equivalent reactance corresponding to the equation (9) is provided. Also in accordance with the value of the control signal to be applied upon the base of the second current source transistor 40, the collector current $I_2$ varies, and a variable reactance circuit for producing the equivalent reactance from zero to the negative given value is provided.

The differential control signal can be applied upon the bases of the first and second current source transistors 37, 40, and the operation of this arrangement is also considered as in the case of FIG. 3.

Figure 6:
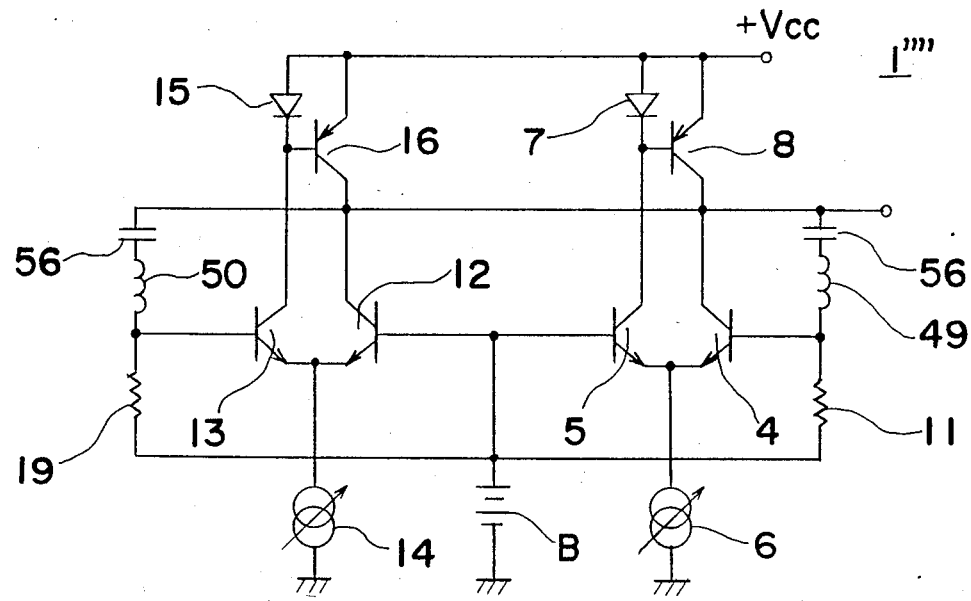

FIG. 6 shows a variable resistance circuit 1'''' of a fifth embodiment of the present invention, wherein the first and second coils 49, 50, instead of the first and second capacitors 10, 18 of FIG. 1, are connected to produce the equivalent inductive reactance in the output terminal 51. In FIG. 6, the decoupling capacitors 56 are provided in association with the coils 49, 50 in order to cut off the direct current to be applied from the output terminal 51. The circuit operation of this embodiment is the same as in FIG. 1, and the positive and negative equivalent inductive reactances are r·gm times as much as the inductive reactances $L_1$ and $L_2$ of the first, second coils 49, 50 is produced at the output terminal 51.

Figure 8:
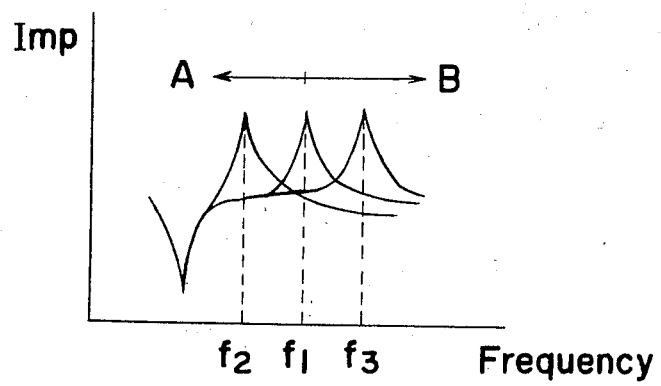
FIG. 8 is a characteristic graph for the purpose of illustrating the operation of FIG. 7.
Figure 7:
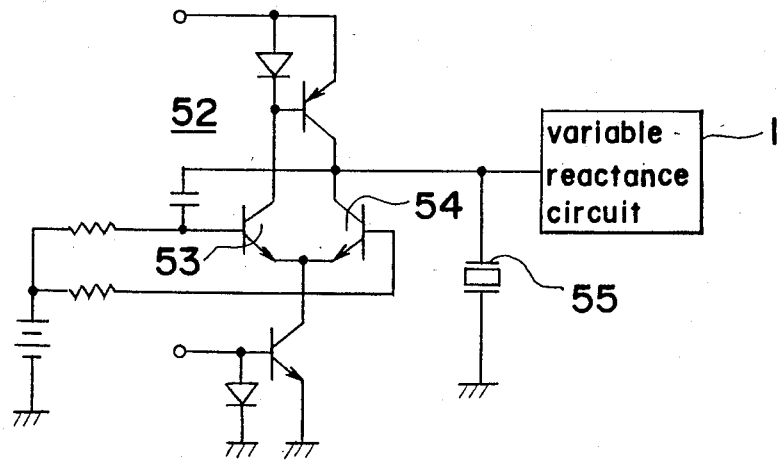
FIG. 7 is a circuit diagram showing an oscillation circuit using a variable reactance circuit of the present invention.

FIG. 7 shows one example in a case where the variable reactance circuit 1 of the present invention is used in the oscillation circuit, which comprises an oscillation circuit 52 composed of a pair of transistors 53, 54 differentially connected, and an oscillation element 55 such as crystal resonator or the like, both of the circuit 52 and the element 55 being connected to a variable reactance circuit 1 shown in FIG. 1, FIG. 3 or FIG. 4 of the present invention. In such a circuit structure as shown in FIG. 7, the equivalent reactance of the variable reactance circuit 1 is connected in parallel with the inductive reactance of the oscillation element 55, and the parallel resonance frequency varies in accordance with the value of the equivalent reactance of the variable reactance circuit 1. As shown in FIG. 8, assume that the parallel resonance frequency natural to the oscillation element 55 is $f_1$ in a condition where the variable reactance circuit 1 is not connected, and the parallel resonance frequency moves as far as $f_2$ in the direction of an arrow A as the equivalent reactance of the variable reactance circuit 1 varies from zero to the positive given value. Also, the parallel resonance frequency moves as far as $f_3$ in the direction of an arrow B as the reactance varies from zero to the negative given value. Accordingly, for example, in FIG. 1, varying the current $I_1$ or $I_2$ of the first variable current source 6 or the second variable current source 14, and the parallel resonance frequency of the oscillation element 55 substantially varies, and the oscillation frequency of the oscillation circuit varies.

As described hereinabove, the present invention has a big advantage of being capable of easily producing the positive and negative equivalent reactance many times larger than the basic reactance element with the use of a circuit which can be integrated. As the equivalent reactance can be varied, across a wide range from a negative given value to a positive given value, in accordance with the control signal, it can have various applications. Also, the embodiment of FIG. 4, as compared with FIG. 1, has an advantage in that the circuit can be easily integrated, because in the circuit construction, the capacitors, the resistors, the current source, etc., which become the basic reactance elements, are used in common in the first, second amplification circuits. The embodiment of FIG. 5 has a large advantage in that the number of the elements is reduced to simplify the construction when the circuit has been integrated, because the current mirror circuit, the capacitors, the resistors, etc. are used in common in the first, second amplification circuits. In addition, as shown in FIG. 7, the variable reactance circuit of the present invention can be used in a VCO (Voltage Control Oscillator) having a crystal resonator or the like which is stable in oscillation frequency, as a basic oscillation element. For example, when the signal from the phase comparator of a PLL circuit is supplied to the variable reactance circuit, the oscillation frequency of the VCO is varied up and down around the natural frequency of the basic oscillation elements. Therefore, a VCO which is stable at the natural frequency can be provided.

Although the present invention has fully been described in connection with the preferred embodiments thereof with reference to the accompanying drawings, it is to be noted that various changes and modifications are apparent to those skilled in the art. Such changes and modifications are to be understood as included within the scope of this invention unless they depart therefrom.

What is claimed is:

1. A variable reactance circuit comprising a first amplification circuit means for operating as a positive equivalent reactance, a second amplification circuit means for operating as a negative equivalent reactance, an output terminal connected in common to an output of the first and second amplification circuit means, a first control means connected to the first amplification circuit means for generating a first control signal for controlling the first amplification circuit means to vary the positive equivalent reactance value of the first amplification circuit means and a second control means connected to the second amplification circuit means for generating a second control signal for controlling the second amplification circuit means to vary the negative equivalent reactance value of the second amplification circuit means, whereby the equivalent reactance of the variable reactance circuit as seen from the output terminal varies from a negative given value of reactance to a positive given value of reactance.

2. The variable reactance circuit as defined in claim 1, wherein the first amplification circuit means comprises a pair of first and second transistors having the emitters thereof connected in common, a first variable current source connected to the common emitter of the first and second transistors, a first current mirror circuit connected to the collectors of the first and second transistors, a first capacitor connected between the collector and the base of the first transistor, and a first resistor connected between the bases of the first and second transistors, the collector of the first transistor being connected to the output terminal.

3. The variable reactance circuit as defined in claim 1, wherein the second amplification circuit comprises a pair of third and fourth transistors having the emitters thereof connected in common, a second variable current source connected to the common emitter of the third and fourth transistors, a second current mirror circuit connected to the collectors of the third and fourth transistors, a second capacitor connected between the collector and the base of the fourth transistor, and a second resistor connected between the bases of the third and fourth transistors, the collector of the fourth transistor being connected to the output terminal.

4. The variable reactance circuit as defined in claim 1, wherein each of the first and second amplification circuit means comprises a pair of transistors having the emitters thereof connected in common, one variable current source connected to both commonly connected emitters of each pair of transistors, current mirror circuits connected to the collectors of each of the pairs of transistors of the first and second amplification circuit means, wherein a first capacitor is connected between the collector and the base of one of the transistors of the first amplification circuit means and a second capacitor is connected between the base of one transistor and the collector of the other transistor of the second amplification circuit means; a first resistor is connected between the bases of the transistors of the first pair of transistors and a second resistor is connected between the bases of the transistors of the second pair of transistors, and wherein the base of the other transistor of the first amplification circuit means is connected to the base of the other transistor of the second amplification circuit means, and the output terminal is connected to the collector of the one transistor of the first amplification circuit means and the collector of the other transistor of the second amplification means.

5. The variable reactance circuit as defined in claim 1, each of the first and second amplification circuit means comprises a pair of transistors having the emitters thereof connected in common; variable current source means connected to the commonly connected emitters of each pair of transistors; current mirror circuits connected to each of the collectors of each of the pairs of transistors; and a resistor connected between the bases of the transistors of each pair of transistors, wherein a first coil is connected between the collector and the base of one of the transistors of the pair of transistors comprising the first amplification circuit means and a second coil is connected between the base of one transistor and the collector of the other transistor of the second amplification circuit means, and wherein the base of the other transistor of the first amplification circuit means is connected to the base of the other transistor of the second amplification circuit means, and the output terminal is connected to the collector of the one transistor of the first amplification circuit means and the other transistor of the second amplification circuit means.

6. A variable reactance circuit comprising a first pair of transistors including, first and second transistors having the emitters thereof connected in common; a second pair of transistors including third and fourth transistors having the emitters thereof connected in common; wherein the bases of the first and fourth transistors are connected in common, the bases of the second and third transistors are connected in common, the collectors of the first and third transistors are connected in common, and the collectors of the second and fourth transistors are connected in common; a fifth transistor having the collector thereof connected to the common emitter of the first and second transistors; a sixth transistor having the collector thereof connected to the common emitter of the third and fourth transistors; a current mirror circuit connected to the collectors of the first, second, third and fourth transistors; a capacitor connected between the collector and the base of the fourth transistor; a resistor having one end connected to the bases of the first and fourth transistors and the other end connected to the bases of the second and third transistors; reactance control input terminal means connected to the bases of the fifth and sixth transistors and an output terminal connected to the collectors of the second and fourth transistors.

7. A variable reactance circuit comprising a first pair of transistors including first and second transistors having the emitters thereof connected in common; a second pair of transistors including third and fourth transistors having the emitters thereof connected in common; wherein the bases of the first and fourth transistors are connected in common, the bases of the second and third transistors are connected in common, the collectors of the first and third transistors are connected in common, and the collectors of the second and fourth transistors being connected in common; a third pair of transistors including fifth and sixth transistors having the emitters thereof connected in common, wherein the collector of the fifth transistor is connected to the common emitter of the first and second transistors, and the collector of the sixth transistor is connected to the common emitter of third and fourth transistors; a current source connected to the common emitter of the fifth and sixth transistors; a current mirror circuit connected to the collectors of the first, second, third, and fourth transistors; a capacitor connected between the collector of the first transistor and the base of the fifth transistor; a resistor connected between the bases of the fifth and sixth transistors; reactance control input terminal means coupled to bases of the first and fourth transistor and to the bases of second and third transistors; and an output terminal connected to the collectors of the first and third transistors.

* * * * *